United States Patent
Chiang et al.

(10) Patent No.: US 9,859,232 B1
(45) Date of Patent: Jan. 2, 2018

(54) SEMICONDUCTOR PACKAGE DEVICE AND METHOD OF MANUFACTURING THE SAME

(71) Applicant: Advanced Semiconductor Engineering, Inc., Kaohsiung (TW)

(72) Inventors: Chung-Hsin Chiang, Kaohsiung (TW); Kuang-Ting Chi, Kaohsiung (TW); Ming-Hsiang Cheng, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/344,392

(22) Filed: Nov. 4, 2016

(51) Int. Cl.
*H01L 23/66* (2006.01)
*H01L 23/552* (2006.01)
*H01L 23/31* (2006.01)

(52) U.S. Cl.
CPC .............. *H01L 23/66* (2013.01); *H01L 23/31* (2013.01); *H01L 23/552* (2013.01); *H01L 2223/6616* (2013.01); *H01L 2223/6677* (2013.01)

(58) Field of Classification Search
CPC ........ H01L 23/66; H01L 23/31; H01L 23/552
See application file for complete search history.

(56) References Cited

U.S. PATENT DOCUMENTS

| | | | | |
|---|---|---|---|---|
| 8,912,959 B2* | 12/2014 | Chiu | ...................... | H01Q 1/243 343/700 MS |
| 2004/0155734 A1* | 8/2004 | Kosemura | ......... | H01L 23/49838 333/246 |
| 2008/0158081 A1* | 7/2008 | Rofougaran | ............ | H01L 23/66 343/787 |
| 2009/0207090 A1* | 8/2009 | Pettus | ..................... | H01L 23/66 343/873 |
| 2010/0026601 A1* | 2/2010 | Chang | ................... | H01L 23/585 343/834 |
| 2016/0240493 A1 | 8/2016 | Lee et al. | | |

* cited by examiner

*Primary Examiner* — Karen Kusumakar
(74) *Attorney, Agent, or Firm* — Foley & Lardner LLP; Cliff Z. Liu

(57) ABSTRACT

The present disclosure provides a semiconductor package device comprising a substrate, a semiconductor device, a first electronic component, an antenna pattern and a first package body. The substrate has a first area and a second area. The semiconductor device is disposed on the first area of the substrate. The first electronic component is disposed on the second area of the substrate. The antenna pattern is disposed on the second area of the substrate and electrically connected to the first electronic component. The first package body encapsulates the first area of the substrate and the semiconductor device and exposes the antenna pattern, the first electronic component and the second area of the substrate.

20 Claims, 16 Drawing Sheets

SEMICONDUCTOR PACKAGE DEVICE AND METHOD OF MANUFACTURING THE SAME

BACKGROUND

1. Technical Field

The present disclosure relates to a semiconductor package device and a method of manufacturing the same, and more particularly, to a semiconductor package device with an antenna and a shielding cover and a method of manufacturing the same.

2. Description of the Related Art

Semiconductor devices have become progressively more complex, driven at least in part by the demand for enhanced processing speeds and smaller sizes. Enhanced processing speeds tend to involve higher clock speeds, which can involve more frequent transitions between signal levels, which, in turn, can lead to a higher level of electromagnetic emissions at higher frequencies or shorter wavelengths. Electromagnetic emissions can radiate from a source semiconductor device, and can be incident upon neighboring semiconductor devices. If the level of electromagnetic emissions at a neighboring semiconductor device is sufficiently high, these emissions can adversely affect the operation of the neighboring semiconductor device. This phenomenon is sometimes referred to as electromagnetic interference (EMI). Smaller sized semiconductor devices can exacerbate EMI by providing a higher density of semiconductor devices within an overall electronic system, and thus, a higher level of undesired electromagnetic emissions at neighboring semiconductor devices. In addition, when antenna patterns are integrated in the semiconductor device, limited space in the semiconductor package device may constrain the design of the integrated antenna. Therefore, it is desirable to design a semiconductor device that satisfies the demands brought on by developments in high density integrated circuits.

SUMMARY

In one or more embodiments of the present disclosure, a semiconductor package device includes a substrate, a semiconductor device, a first electronic component, an antenna pattern and a first package body. The substrate has a first area and a second area. The semiconductor device is disposed on the first area of the substrate. The first electronic component is disposed on the second area of the substrate. The antenna pattern is disposed on the second area of the substrate and electrically connected to the first electronic component. The first package body encapsulates the first area of the substrate and the semiconductor device and exposes the antenna pattern, the first electronic component and the second area of the substrate.

In one or more embodiments of the present disclosure, an electronic module includes a circuit board, a first antenna pattern, and a semiconductor package device. The first antenna pattern is disposed on the circuit board. The semiconductor package device is disposed on the circuit board. The semiconductor package device includes a substrate, a semiconductor device and a second antenna pattern. The substrate has a first area and a second area. The semiconductor device is disposed on the first area of the substrate. The second antenna pattern is disposed on the second area of the substrate and is electrically connected to the first antenna pattern on the circuit board.

In one or more embodiments of the present disclosure, a semiconductor package device includes an antenna pattern, a first electronic component, a second electronic component and a third electronic component. The antenna pattern includes a feeding line, a first line segment, a second line segment and a third line segment. The feeding line is disposed between the first line segment and the second line segment. The second line segment is disposed between the feeding line and the third line segment. The first electronic component electrically connects the first line segment and the feeding line. The second electronic component electrically connects the feeding line and the second line segment. The third electronic component electrically connects the second line segment and the third line segment.

Figure 1A:
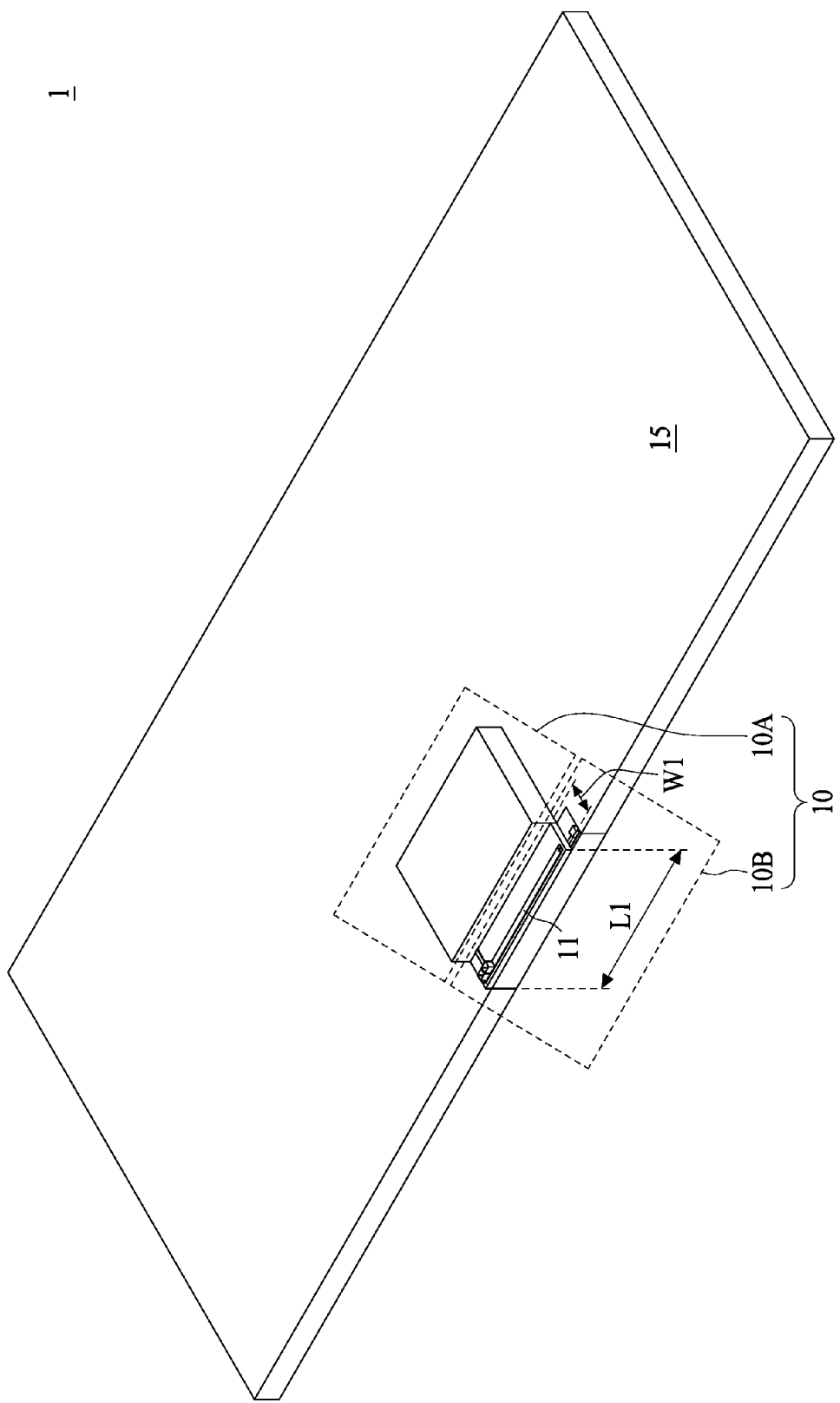
FIG. 1A illustrates a perspective view of a semiconductor package device in accordance with some embodiments of the present disclosure.

Common reference numerals are used throughout the drawings and the detailed description to indicate the same or similar components. The present disclosure will be more apparent from the following detailed description taken in conjunction with the accompanying drawings.

DETAILED DESCRIPTION

FIG. 1A illustrates a perspective view of a semiconductor package device 1 in accordance with some embodiments of the present disclosure. The semiconductor package device 1 includes a substrate 10, an antenna pattern 11 and a carrier 15.

The substrate 10 may be, for example, a printed circuit board, such as a paper-based copper foil laminate, a composite copper foil laminate, or a polymer-impregnated glass-fiber-based copper foil laminate. The substrate 10 includes a first area 10A and a second area 10B adjacent to the first area 10A. In some embodiments, a ratio of a width W1 of the second area 10B of the substrate 10 to a length L1 of the second area 10B of the substrate 10 is less than about 0.25. In some embodiments, a semiconductor device is disposed on the first area 10A of the substrate 10.

In some embodiments, the antenna pattern 11 is disposed over the second area 10B of the substrate 10 while electronic components are disposed over the first area 10A of the substrate 10. The substrate 10 may include an interconnection structure, such as a redistribution layer (RDL), for electrical connection between the electronic components (e.g., the electronic components disposed over the first area 10A of the substrate 10) and/or between the electronic components and the antenna pattern 11. In some embodiments, a ratio of a width W1 of the second area 10B of the substrate 10 to an operating wavelength of the antenna pattern 11 is less than about 0.013.

The carrier 15 may be, for example, a printed circuit board, such as a paper-based copper foil laminate, a composite copper foil laminate, or a polymer-impregnated glass-fiber-based copper foil laminate. The carrier 15 is used to support the substrate 10. The carrier 15 may include one or more circuits in addition to the substrate 10. The carrier 15 may include an interconnection structure, such as an RDL, for electrical connection between the circuits (e.g., the one or more circuits at the carrier 15) and/or between the circuits and the substrate 10. In some embodiments, the carrier 15 and the substrate 10 include a same material. Alternatively, the carrier 15 and the substrate 10 may include different materials.

As shown in FIG. 1A, in some embodiments, the substrate 10 is disposed at a middle of an edge of the carrier 15. In other embodiments, the substrate 10 may be disposed at a corner of the edge of the carrier 15. In other embodiments, the substrate 10 may be disposed at any location along the edge of the carrier 15 depending on a design requirement.

Figure 1B:
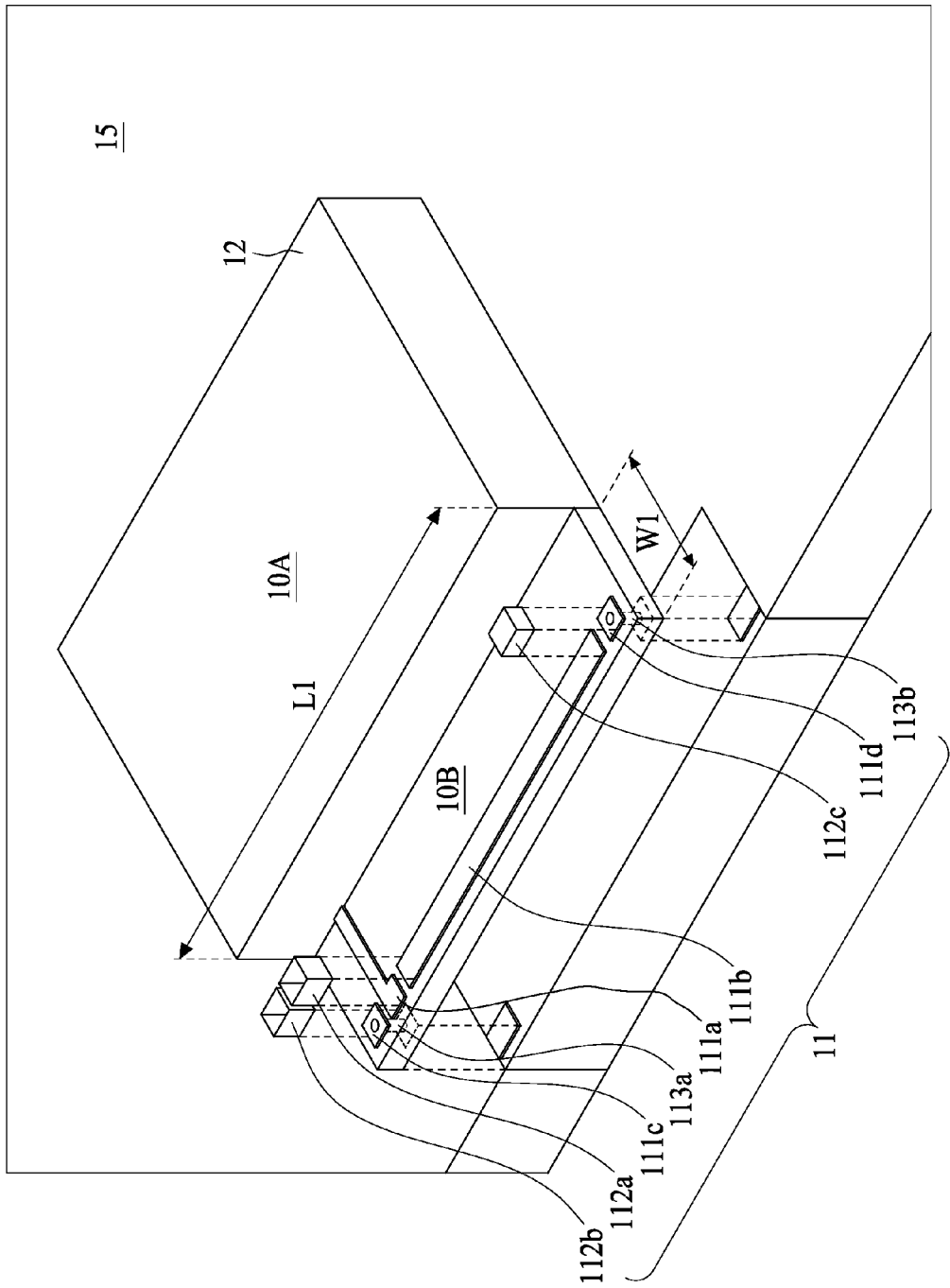
FIG. 1B illustrates an enlarged view of a portion of the semiconductor package device shown in FIG. 1A in accordance with some embodiments of the present disclosure.

FIG. 1B illustrates an enlarged view of the substrate 10 shown in FIG. 1A. The electronic components are disposed over the first area 10A of the substrate 10. The electronic components may be active or passive components or a combination thereof. An active electronic component may be, for example, an integrated circuit (IC) chip or a die or other semiconductor device. A passive electronic component may be, for example, a capacitor, a resistor or an inductor. Each electronic component may be electrically connected to one or more other electronic components, the substrate 10 (e.g., to the RDL), or the antenna pattern 11, and electrical connection may be attained by way of flip-chip or wire-bond techniques.

In some embodiments, the antenna pattern 11 is disposed on a top surface of the second area 10B of the substrate 10. The antenna pattern 11 includes a feeding line 111a, line segments 111b, 111c, 111d and electronic components 112a, 112b, 112c. The feeding line 111a extends into the first area 10A of the substrate 10 to be electrically connected to the electronic components in the first area 10A of the substrate 10 (e.g., the feeding line 111a is electrically connected to a semiconductor device in the first area 10A of the substrate 10). The line segment 111b is located at one side (e.g., a first side) of the feeding line 111a and extends along an edge of the second area 10B of the substrate 10. The line segment 111b is spaced or physically separated from the feeding line 111a. The line segment 111c is located at an opposing side (e.g., a second side) of the feeding line 111a (e.g., at a side of the feeding line 111a opposite the side that the line segment 111b is located). The line segment 111c is spaced or physically separated from the feeding line 111a. The line segment 111d is located at one side of the line segment 111b and spaced or physically separated from the line segment 111b. For example, the feeding line 111a is located at a first side of the line segment 111b and the line segment 111d is located at a second side opposite the first side of the line segment 111b.

In some embodiments, the electronic component 112a is disposed over the feeding line 111a and the line segment 111b and electrically connects the feeding line 111a to the line segment 111b. The electronic component 112b is disposed over the feeding line 111a and the line segment 111c and electrically connects the feeding line 111a to the line segment 111c. The electronic component 112c is disposed over the line segment 111b and the line segment 111d and electrically connects the line segment 111b to the line segment 111d. The electronic components 112a, 112b, 112c are, for example, capacitors, adjustable or variable capacitors, inductors, adjustable or variable inductors, resistors, adjustable or variable resistors or a combination thereof.

In some embodiments, a through via 113a penetrates the second area 10B of the substrate 10 and electrically connects the line segment 111c to a grounding layer of the carrier 15. A through via 113b penetrates the second area 10B of the substrate 10 and electrically connects the line segment 111d to the grounding layer of the carrier 15.

In some embodiments, a package body is disposed on a top surface of the first area 10A of the substrate 10 and encapsulates the electronic components disposed on the first area 10A of the substrate 10. The package body exposes the second area 10B of the substrate 10. In other embodiments, the package body may encapsulate both of the first area 10A and the second area 10B of the substrate 10. For example, a first package body may encapsulate the first area 10A of the substrate 10 and a second package body may encapsulate the second area 10B of the substrate 10. In some embodiments, the package body includes an epoxy resin having fillers dispersed therein.

In some embodiments, a shield 12 is disposed on an external surface of the package body and covers the package body and electronic components. The shield 12 is electrically connected to a grounding element, such as a via, metal layer or metal trace, of the substrate 10. In some embodiments, the shield 12 is a conformal shield. In some embodiments, the shield 12 is a conductive thin film, and may include, for example, aluminum (Al), copper (Cu), chromium (Cr), tin (Sn), gold (Au), silver (Ag), nickel (Ni) or stainless steel, or a mixture, an alloy, or other combination thereof. The shield 12 may include a single conductive layer or multiple conductive layers. In embodiments in which the shield 12 includes multiple conductive layers, the multiple conductive layers may each include a same material, or ones of the multiple conductive layers may include different materials (e.g., while others of the multiple conductive layers may include a same material), or each of the multiple conductive layers may include different materials from the others of the multiple conductive layers. In some embodiments, each conductive layer of the shield 12 has a thickness of up to about 200 micrometers (μm), such as up to about 150 μm, up to about 100 μm, up to about 50 μm, up to about 10 μm, up to about 5 μm, up to about 1 μm, or up to about 500 nanometers (nm). In some embodiments, each conductive layer of the shield 12 has a thickness of down to about 100 nm or less, down to about 50 nm or less, or down to about 10 nm or less. In some embodiments in which the shield 12 includes multiple conductive layers, different conductive layers may have different thicknesses.

In some embodiments, the package body is disposed on both the first area 10A and the second area 10B of the substrate 10. That is, the electronic components disposed on the first area 10A of the substrate 10, the antenna pattern 11 disposed on the second area 10B, and the electronic components 112a, 112b, 112c disposed on the second area 10B are covered by the package body. However, in some embodiments, the shield 12 is selectively disposed on the external surface of the package body corresponding to the first area 10A of the substrate 10. That is, the shield 12 does not cover the external surface of the package body corresponding to the second area 10B of the substrate 10 and the external surface of the package body corresponding to the second area 10B of the substrate 10 is exposed from the shield 12.

As mentioned above, since the electronic components 112a, 112b, 112c may be adjustable or variable capacitors, inductors, or resistors, the performance or the operating frequency of the antenna pattern 11 can be adjusted by changing the capacitors or the inductors, which form a part of the antenna pattern 11. Therefore, the operating frequency of the antenna pattern 11 can be more accurate and the performance of the semiconductor package device 1 can be improved. In addition, in some embodiments, a ratio of a width of an antenna area (e.g., W1) to a length of the antenna area (e.g., L1) can be reduced to less than about 0.25, which would minimize the size of the semiconductor package device. Furthermore, the shield 12 may protect the electronic components disposed on the first area 10A of the substrate 10 from the radio frequency signal radiated from the antenna pattern 11.

Figure 2:
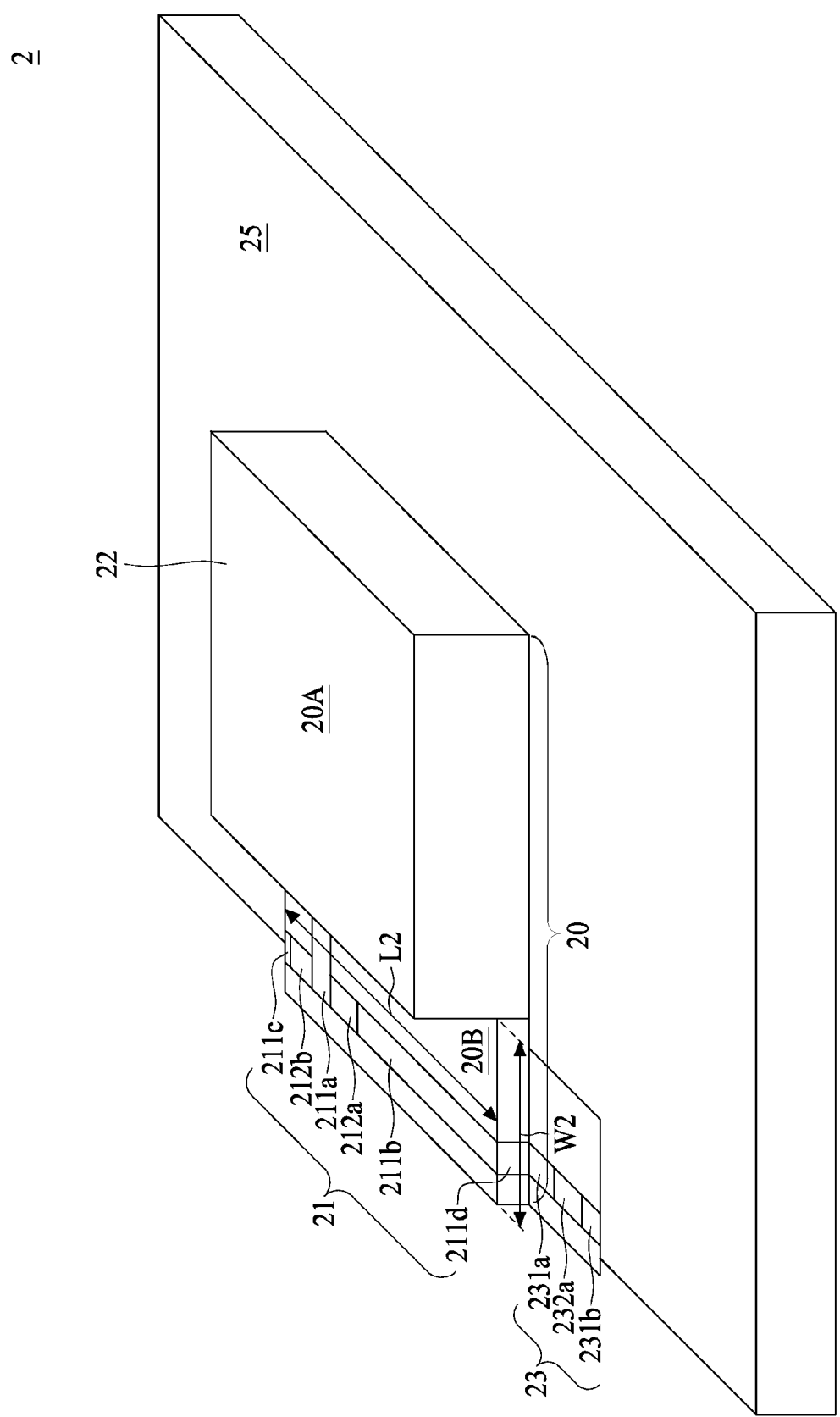
FIG. 2 illustrates a perspective view of a semiconductor package device in accordance with some embodiments of the present disclosure.

FIG. 2 illustrates a perspective view of a semiconductor package device 2 in accordance with some embodiments of the present disclosure. The semiconductor package device 2 includes a substrate 20, a first antenna pattern 21, a second antenna pattern 23 and a carrier 25.

The substrate 20 may be, for example, a printed circuit board, such as a paper-based copper foil laminate, a composite copper foil laminate, or a polymer-impregnated glass-fiber-based copper foil laminate. The substrate 20 includes a first area 20A and a second area 20B adjacent to the first area 20A. In some embodiments, a ratio of a width W2 of the second area 20B of the substrate 20 to a length L2 of the second area 20B of the substrate 20 is less than about 0.25. In some embodiments, a semiconductor device is disposed on the first area 20A of the substrate 20.

The carrier 25 may be, for example, a printed circuit board, such as a paper-based copper foil laminate, a composite copper foil laminate, or a polymer-impregnated glass-fiber-based copper foil laminate. The carrier 25 is used to support the substrate 20. The carrier 25 may include one or more circuits in addition to the substrate 20. The carrier 25 may include an interconnection structure, such as an RDL, for electrical connection between the circuits (e.g., the one or more circuits at the carrier 25) and/or between the circuits and the substrate 20. In some embodiments, the carrier 25 and the substrate 20 include a same material. Alternatively, the carrier 25 and the substrate 20 may include different materials.

As shown in FIG. 2, the substrate 20 is disposed at a middle of an edge of the carrier 25. In other embodiments, the substrate 20 may be disposed at a corner of the edge of the carrier 25. In other embodiments, the substrate 20 may be disposed at any location along the edge of the carrier 25 depending on a design requirement.

In some embodiments, electronic components are disposed over the first area 20A of the substrate 20. The electronic components may be active or passive components or a combination thereof. An active electronic component may be, for example, an IC chip or a die or other semiconductor device. A passive electronic component may be, for example, a capacitor, a resistor or an inductor.

In some embodiments, the first antenna pattern 21 is disposed over the second area 20B of the substrate 20. The first antenna pattern 21 includes a feeding line 211a, line segments 211b, 211c, 211d and electronic components 212a, 212b. The feeding line 211a extends into the first area 20A of the substrate 20 to be electrically connected to the electronic components in the first area 20A of the substrate 20 (e.g., the feeding line 211a is electrically connected to a semiconductor device in the first area 20A of the substrate 20). The line segment 211b is located at one side (e.g., a first side) of the feeding line 211a and extends along the edge of the second area 20B of the substrate 20. The line segment 211b is spaced or separated from the feeding line 211a. The line segment 211c is located at an opposing side (e.g., a second side) of the feeding line 211a (e.g., at a side of the feeding line 211a opposite the side that the line segment 211b is located). The line segment 211c is spaced or separated from the feeding line 211a.

In some embodiments, the electronic component 212a is disposed over the feeding line 211a and the line segment 211b and electrically connects the feeding line 211a to the line segment 211b. The electronic component 212b is disposed over the feeding line 211a and the line segment 211c and electrically connects the feeding line 211a to the line segment 211c. The electronic components 212a, 212b are, for example, capacitors, adjustable or variable capacitors, inductors, adjustable or variable inductors, resistors, adjustable or variable resistors or a combination thereof. A through via penetrates the second area 20B of the substrate 20 and electrically connects the line segment 211c to a grounding layer of the carrier 25.

In some embodiments, the second antenna pattern 23 is disposed over the carrier 25. The second antenna pattern 23 includes line segments 231a, 231b and an electronic component 232a. The line segment 231a is electrically connected to the first antenna pattern 21 through the line segment 211d located at a sidewall surface of the substrate 20. The line segment 231a is spaced or separated from the line segment 231b.

The electronic component 232a is disposed over the line segment 231a and the line segment 231b and electrically connects the line segment 231a to the line segment 231b. The electronic component 232a is, for example, a capacitor, an adjustable or variable capacitor, an inductor, an adjustable or variable inductor, a resistor, an adjustable or variable resistor, or a combination thereof. In some embodiments, a ratio of the width W2 of the second area 20B of the substrate 20 to an operating wavelength of the first antenna pattern 21 and the second antenna pattern 23 is less than about 0.013.

In some embodiments, a package body is disposed on a top surface of the first area 20A of the substrate 20 and encapsulates the electronic components disposed on the first area 20A of the substrate 20. The package body exposes the second area 20B of the substrate 20. In other embodiments, the package body may encapsulate both of the first area 20A and the second area 20B of the substrate 20. For example, a first package body may encapsulate the first area 20A of the substrate 20 and a second package body may encapsulate the second area 20B of the substrate 20. In some embodiments, the package body includes an epoxy resin having fillers dispersed therein.

In some embodiments, a shield 22 is disposed on an external surface of the package body and covers the package body and electronic components. The shield 22 is electrically connected to a grounding element, such as a via, metal layer or metal trace, of the substrate 20. In some embodiments, the shield 22 is a conformal shield. In some embodiments, the shield 12 is a conductive thin film, and may include, for example, Al, Cu, Cr, Sn, Au, Ag, Ni or stainless steel, or a mixture, an alloy, or other combination thereof. The shield 22 may include a single conductive layer or multiple conductive layers. In embodiments in which the shield 22 includes multiple conductive layers, the multiple conductive layers may each include a same material, or ones of the multiple conductive layers may include different materials (e.g., while others of the multiple conductive layers may include a same material), or each of the multiple conductive layers may include different materials from the others of the multiple conductive layers. In some embodiments, each conductive layer of the shield 22 has a thickness of up to about 200 µm, such as up to about 150 µm, up to about 100 µm, up to about 50 µm, up to about 10 µm, up to about 5 µm, up to about 1 µm, or up to about 500 nm. In some embodiments, each conductive later of the shield 22 has a thickness of down to about 100 nm or less, down to about 50 nm or less, or down to about 10 nm or less. In some embodiments in which the shield 22 includes multiple conductive layers, different conductive layers may have different thicknesses.

In some embodiments, the package body is disposed on both the first area 20A and the second area 20B of the substrate 20. That is, the electronic components disposed on the first area 20A of the substrate 20, the first antenna pattern 21 disposed on the second area 20B, and the electronic components 212a, 212b are covered by the package body. However, in some embodiments, the shield 22 is selectively disposed on the external surface of the package body corresponding to the first area 20A of the substrate 20. That is, the shield 22 does not cover the external surface of the package body corresponding to the second area 20B of the substrate 20 and the external surface of the package body corresponding to the second area 20B of the substrate 20 is exposed from the shield 22.

As mentioned above, since the electronic components 212a, 212b, 232a may be adjustable or variable capacitors, inductors or resistors, the performance or the operating frequency of the first antenna pattern 21 and the second antenna pattern 23 can be adjusted by changing the capacitors or the inductors. In addition, in comparison with the semiconductor package device 1 in FIG. 1, since the electronic component 232a is located outside the second area 20B of the substrate 20, an antenna area of the first antenna pattern 21 may be increased, which may in turn enhance the performance of the semiconductor package device 2. Furthermore, the shield 22 may protect the electronic components disposed on the first area 20A of the substrate 20 from the radio frequency signal radiated from the first antenna pattern 21.

Figure 3:
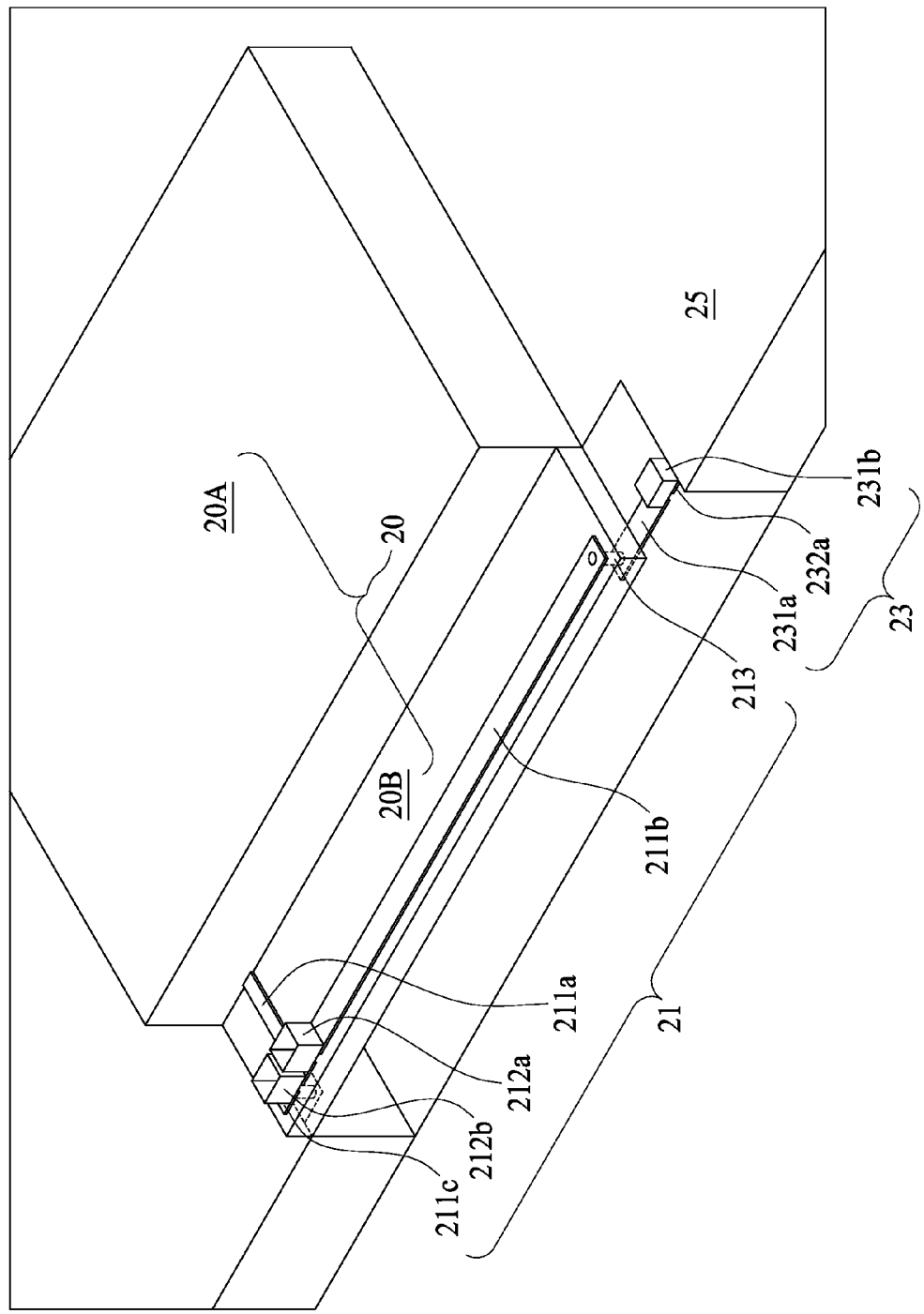
FIG. 3 illustrates a perspective view of a semiconductor package device in accordance with some embodiments of the present disclosure.

FIG. 3 illustrates a perspective view of a semiconductor package device 3 in accordance with some embodiments of the present disclosure. The semiconductor package device 3 is similar to the semiconductor package device 2. However, referring to FIG. 3, in some embodiments, the first antenna pattern 21 and the second antenna pattern 23 are electrically connected through a through via 213. The through via 213 penetrates the second area 20B of the substrate 20 and electrically connects the line segment 211b of the first antenna pattern 21 to the line segment 231a of the second antenna pattern 23. In some embodiments, the via 213 is beneath or below the line segment 211b and the electronic components 212a and 212b.

Figure 4:
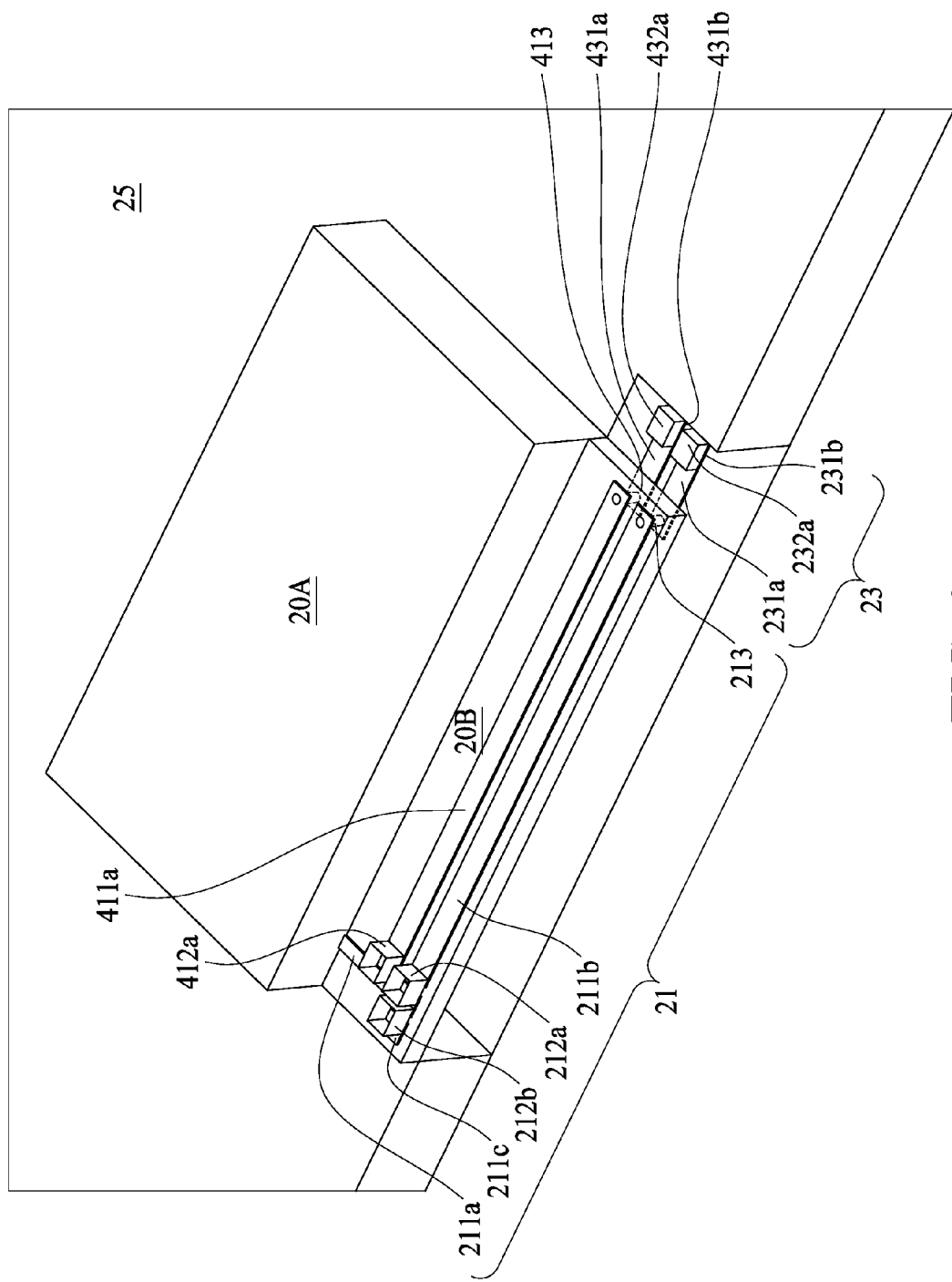
FIG. 4 illustrates a perspective view of a semiconductor package device in accordance with some embodiments of the present disclosure.

FIG. 4 illustrates a perspective view of a semiconductor package device 4 in accordance with embodiments of the present disclosure. The semiconductor package device 4 is similar to the semiconductor package device 3. However, the semiconductor package 4 further includes line segments 411a, 431a, 431b and electronic components 412a, 432a.

In some embodiments, the line segment 411a is disposed over the second area 20B of the substrate 20 and is parallel to the line segment 211b. The line segment 411a is spaced or physically separated from the feeding line 211a and the line segment 211b. The electronic component 412a is disposed over the feeding line 211a and the line segment 411a and electrically connects the feeding line 211a to the line segment 411a.

The line segment 431a is disposed on the carrier 25 and is parallel to the line segment 231a. The line segment 431a is spaced or physically separated from the line segment 231a. The line segment 431b is disposed on the carrier 25 and spaced or physically separated from the line segment 431a. The electronic component 432a is disposed over the line segment 431a and the line segment 431b and electrically connects the line segment 431a to the line segment 431b. A through via 413 penetrates the second area 20B of the substrate 20 and electrically connects the line segment 411a to the line segment 431a.

In some embodiments, by adding another antenna pattern (e.g., as formed by the line segments 411a, 431a, 431b and the electronic components 412a, 432a), another loop trace can be formed to obtain another antenna resonant frequency. Therefore, the antenna of the semiconductor package device 4 can be designed as a dual band antenna or a broadband antenna.

FIGS. 5A-5F illustrate a method of manufacturing a semiconductor package device in accordance with some embodiments of the present disclosure.

Figure 5A:
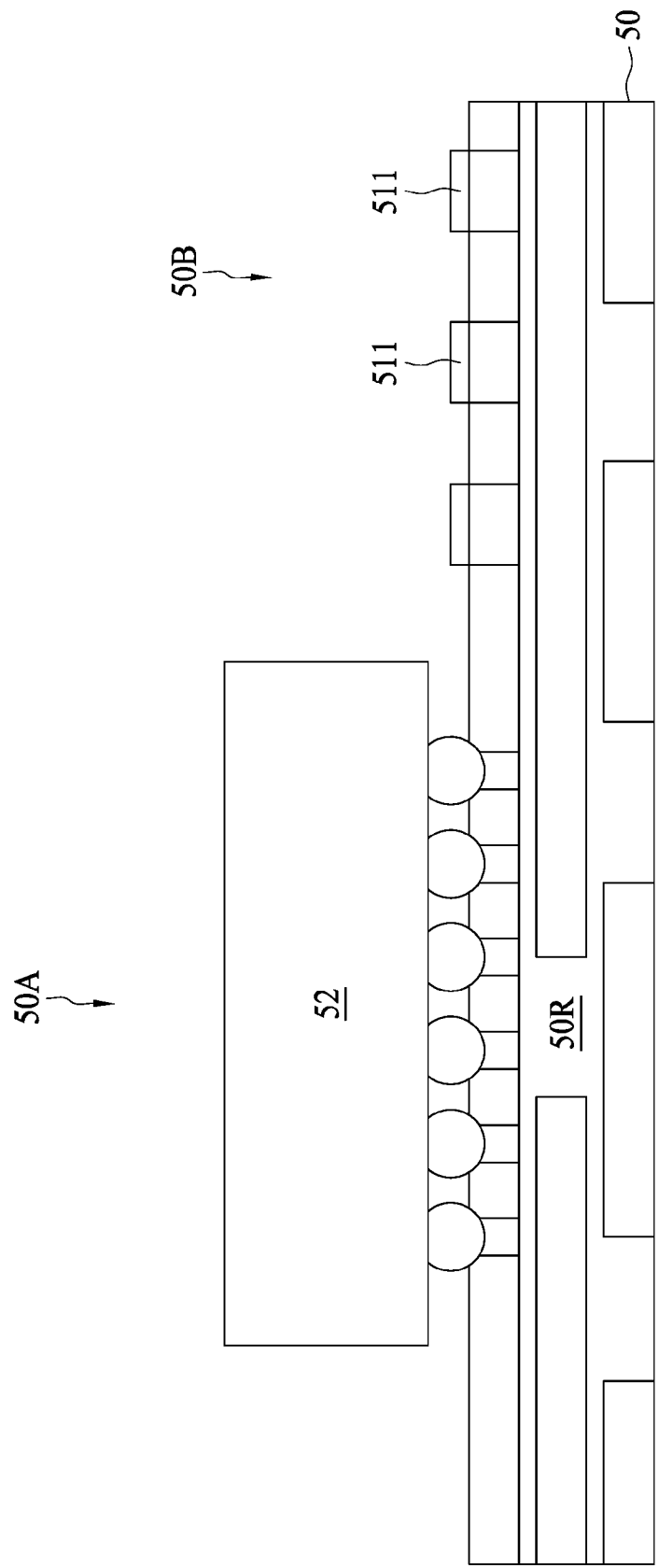
FIG. 5A, FIG. 5B, FIG. 5C, FIG. 5D, FIG. 5E, and FIG. 5F illustrate a method of manufacturing a semiconductor package device in accordance with some embodiments of the present disclosure.

Referring to FIG. 5A, a substrate 50 is provided. The substrate 50 may be one of a plurality of substrates, such as a plurality of substrates that are manufactured concurrently. The substrate 50 may be, for example, a printed circuit board, such as a paper-based copper foil laminate, a composite copper foil laminate, or a polymer-impregnated glass-fiber-based copper foil laminate. The substrate 50 may include an interconnection structure 50R, such as an RDL, for electrical connection between components disposed on the substrate 50. The substrate 50 has a first area 50A and a second area 50B. In some embodiments a semiconductor device is disposed on the first area 50A of the substrate 50.

In some embodiments, one or more electronic components 52 are mounted on a top surface of the first area 50A of each substrate 50. The electronic component 52 may be an active or passive component. The electronic component 52 may be flip-chip or wire-bonded to the substrate 50. An active electronic component may be, for example, an IC chip or a die or other semiconductor device. A passive electronic component may be, for example, a capacitor, a resistor or an inductor.

In some embodiments, an antenna pattern 511 is formed on the top surface of the second area 50B of each substrate 50. The antenna pattern 511 is spaced or physically separated from the electronic component 52 mounted on the first area 50A of the substrate 50. A feeding line of the antenna pattern 511 is electrically connected to the electronic component 52 through the interconnection structure 50R of the substrate 50. In other words, the feeding line of the antenna pattern 511 is electrically connected to the electronic component 52 that may be part of a semiconductor device mounted on the first area 50A of the substrate 50.

Figure 5B:
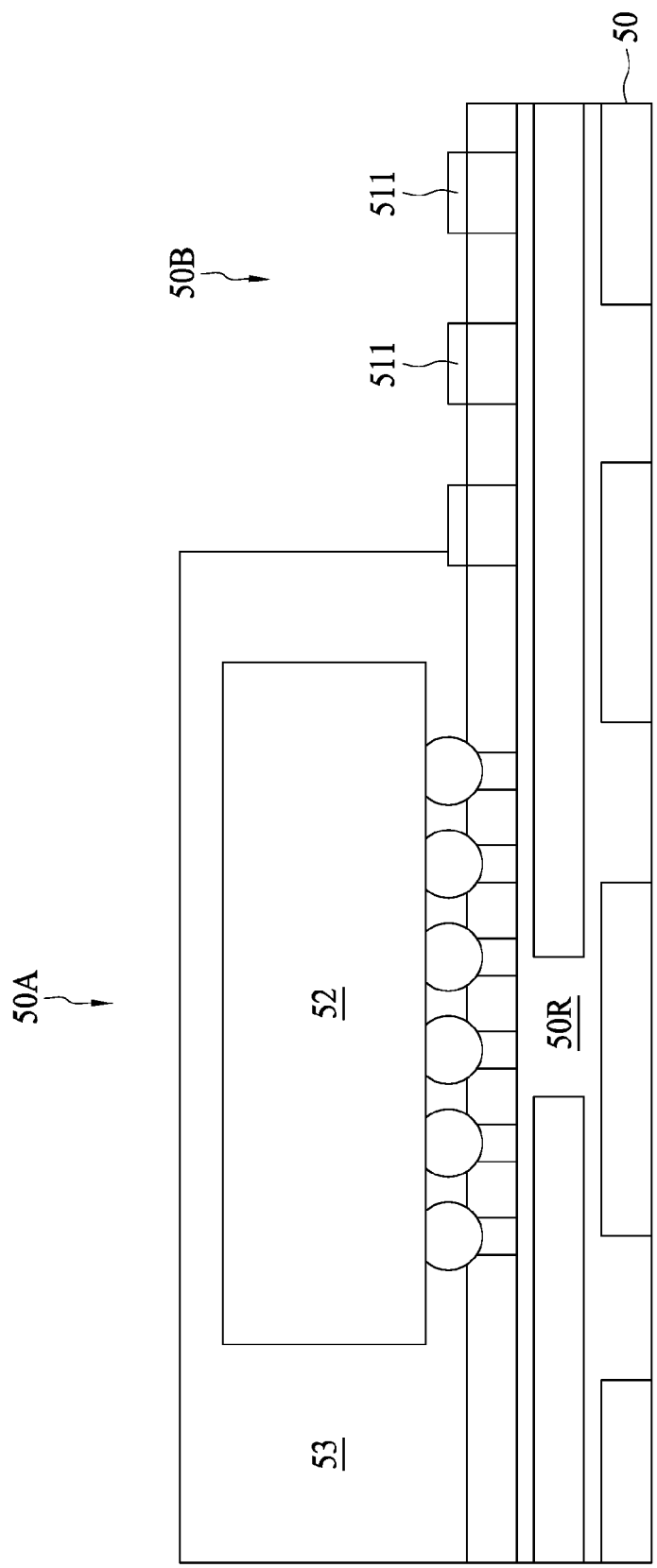

Referring to FIG. 5B, a package body 53 is formed on the first area 50A of the substrate 50 to encapsulate the top surface of the first area 50A of the substrate 50 and the electronic component 52, and to expose the second area 50B of the substrate 50 and the antenna pattern 511. In some embodiments, the package body 53 includes an epoxy resin having fillers dispersed therein. The package body 53 may be formed by a molding technique, such as selective molding, transfer molding or compression molding.

Figure 5C:
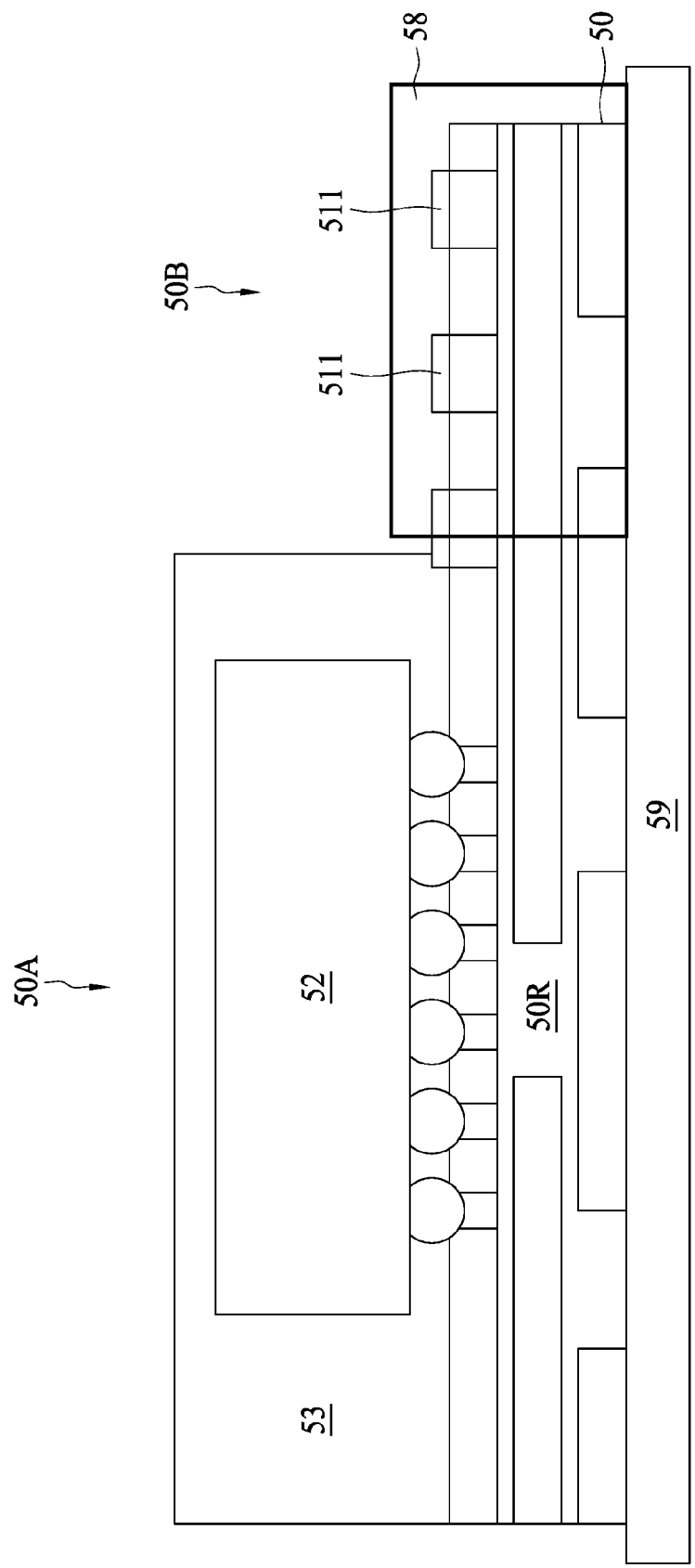

Referring to FIG. 5C, the substrate 50 is placed on a carrier 59. A protective layer 58 is formed to cover the second area 50B of the substrate 50 and the antenna pattern 511. In some embodiments, the protective layer 58 may be a tape or a mask, formed of ultra violet (UV) cure glue or thermal cure glue.

Figure 5D:
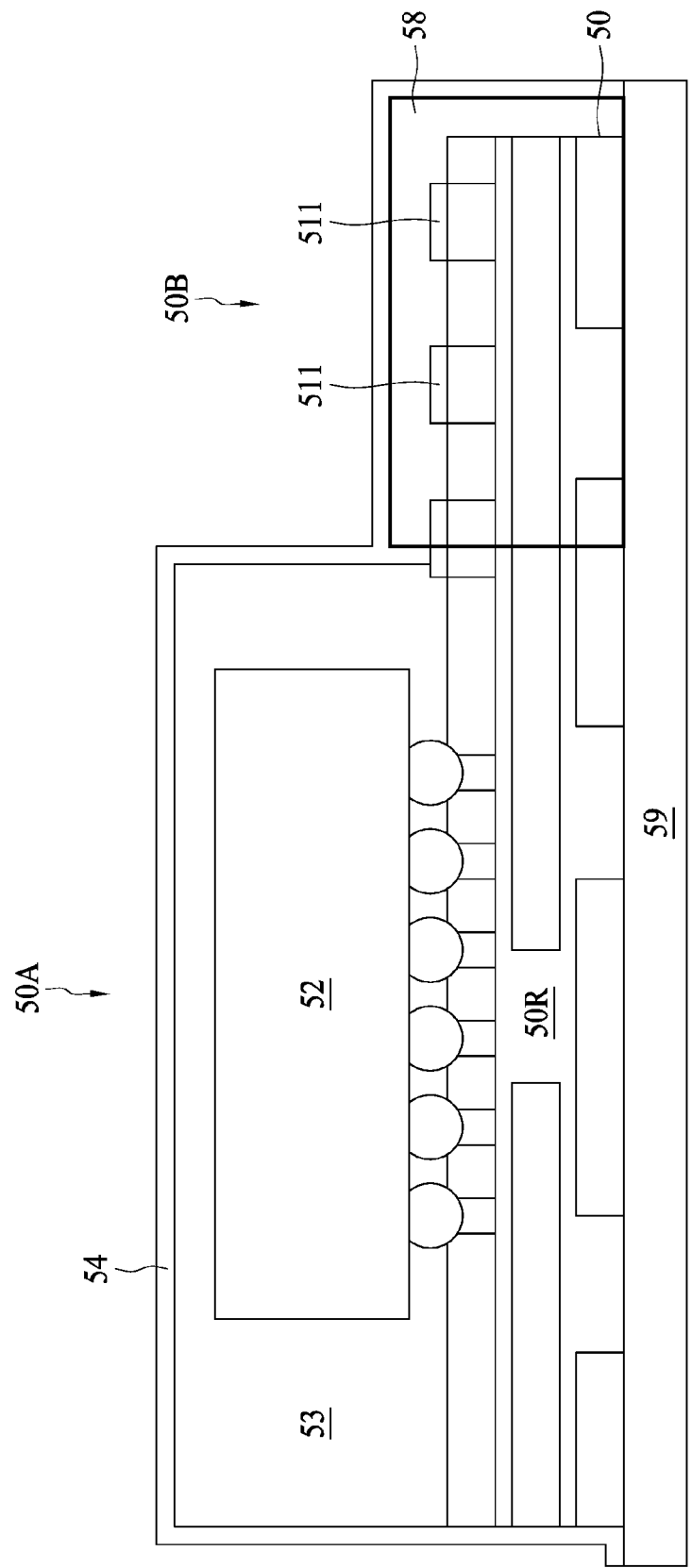

Referring to FIG. 5D, a conformal shield 54 is formed to cover the portions exposed from the protective layer 58. In some embodiments, the conformal shield 54 is a conductive thin film, and may include, for example, Al, Cu, Cr, Sn, Au, Ag, Ni or stainless steel, or a mixture, an alloy, or other combination thereof. The conformal shield 54 may be formed by sputtering a metal coating or by any other suitable process. The conformal shield 54 may include a single conductive layer. In accordance with some embodiments of the present disclosure, the conformal shield 54 may include several conductive layers formed of the same material or of different materials. In some embodiments, each conductive layer may have a thickness of, for example, up to about 200 μm, up to about 150 μm, up to about 100 μm, up to about 50 μm, up to about 10 μm, up to about 5 μm, up to about 1 μm, or up to about 500 nm. In some embodiments, each conductive layer may have a thickness of, for example, down to about 100 nm or less, down to about 50 nm or less, or down to about 10 nm or less.

Figure 5E:
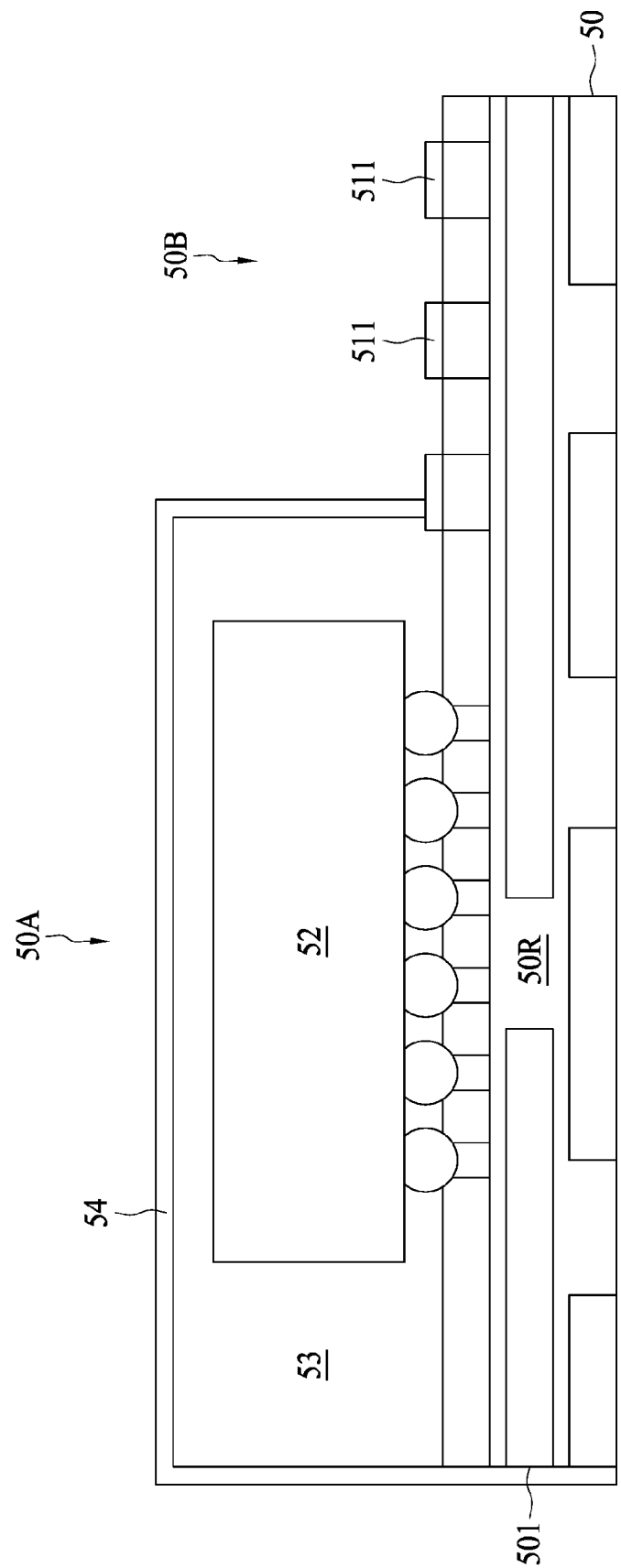

Referring to FIG. 5E, the protective layer 58 and the carrier 59 are removed. Therefore, the conformal shield 54 remains on the package body 53 and a lateral surface 501 of the first area 50A of the substrate 50.

Figure 5F:
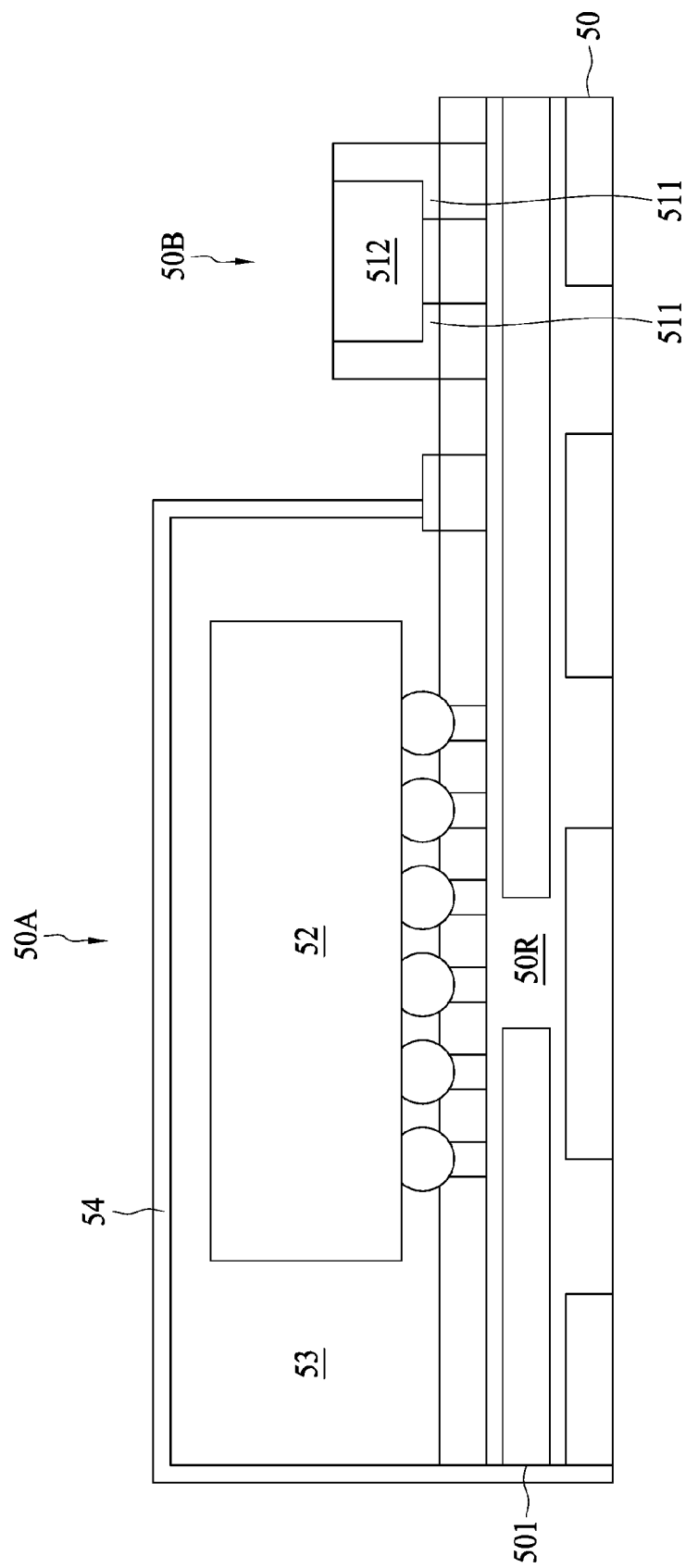

Referring to FIG. 5F, an electronic component 512 is disposed over the antenna pattern 511 to electrically connect one line segment of the antenna pattern 511 to another line segment of the antenna pattern 511. The electronic component 512 is, for example, a capacitor, an adjustable or variable capacitor, an inductor, an adjustable or variable inductor, a resistor, an adjustable or variable resistor or a combination thereof. In some embodiments, the substrate 50 then may be bonded to a main board or a system board to form a semiconductor package device (e.g., the semiconductor package device 1 as shown in FIG. 1A).

FIGS. 6A-6E illustrate a method of manufacturing a semiconductor package device in accordance with some embodiments of the present disclosure.

Figure 6A:
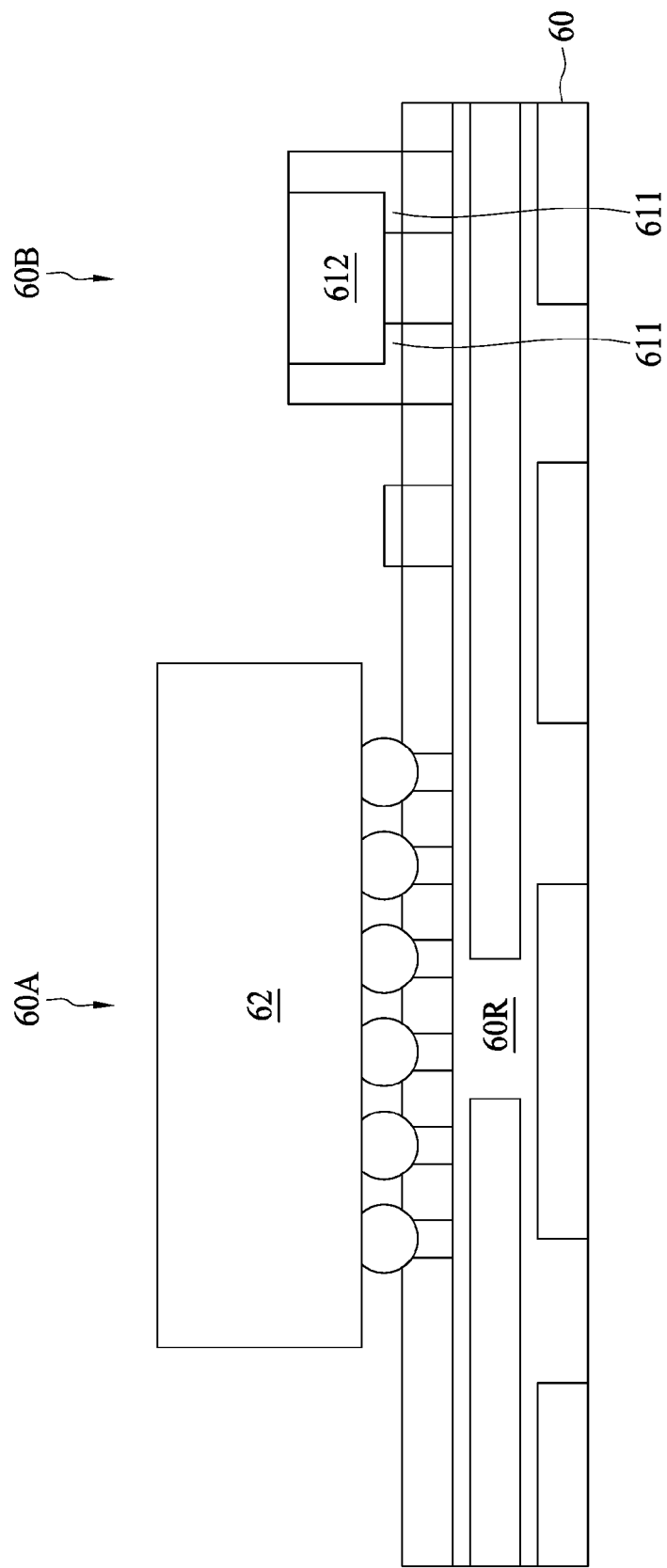
FIG. 6A, FIG. 6B, FIG. 6C, FIG. 6D, and FIG. 6E illustrate a method of manufacturing a semiconductor package device in accordance with some embodiments of the present disclosure.

Referring to FIG. 6A, a substrate 60 is provided. The substrate 60 may be one of a plurality of substrates, such as a plurality of substrates that are manufactured concurrently. The substrate 60 may be, for example, a printed circuit board, such as a paper-based copper foil laminate, a composite copper foil laminate, or a polymer-impregnated glass-fiber-based copper foil laminate. The substrate 60 may include an interconnection structure 60R, such as an RDL, for electrical connection between components disposed on the substrate 60. The substrate 60 has a first area 60A and a second area 60B. In some embodiments a semiconductor device is disposed on the first area 60A of the substrate 60.

In some embodiments, one or more electronic components 62 are mounted on a top surface of the first area 60A of each substrate 60. The electronic component 62 may be an active or passive component. The electronic component 62 may be flip-chip or wire-bonded to the substrate 60. An active electronic component may be, for example, an IC chip or a die or other semiconductor device. A passive electronic component may be, for example, a capacitor, a resistor or an inductor.

In some embodiments, an antenna pattern 611 is formed on the top surface of the second area 60B of each substrate 60. The antenna pattern 611 is spaced or physically separated from the electronic component 62 mounted on the top surface of the first area 60A of the substrate 60. A feeding line of the antenna pattern 611 is electrically connected to the electronic component 62 through the interconnection structure 60R of the substrate 60. In other words, the feeding line of the antenna pattern 611 is electrically connected to the electronic component 62 that may be part of a semiconductor device mounted on the first area 60A of the substrate 60.

In some embodiments, an electronic component 612 is disposed over the antenna pattern 611 to electrically connect one line segment of the antenna pattern 611 to another line segment of the antenna pattern 611. The electronic component 612 is, for example, a capacitor, an adjustable or variable capacitor, an inductor, an adjustable or variable inductor, a resistor, an adjustable or variable resistor or a combination thereof.

Figure 6B:
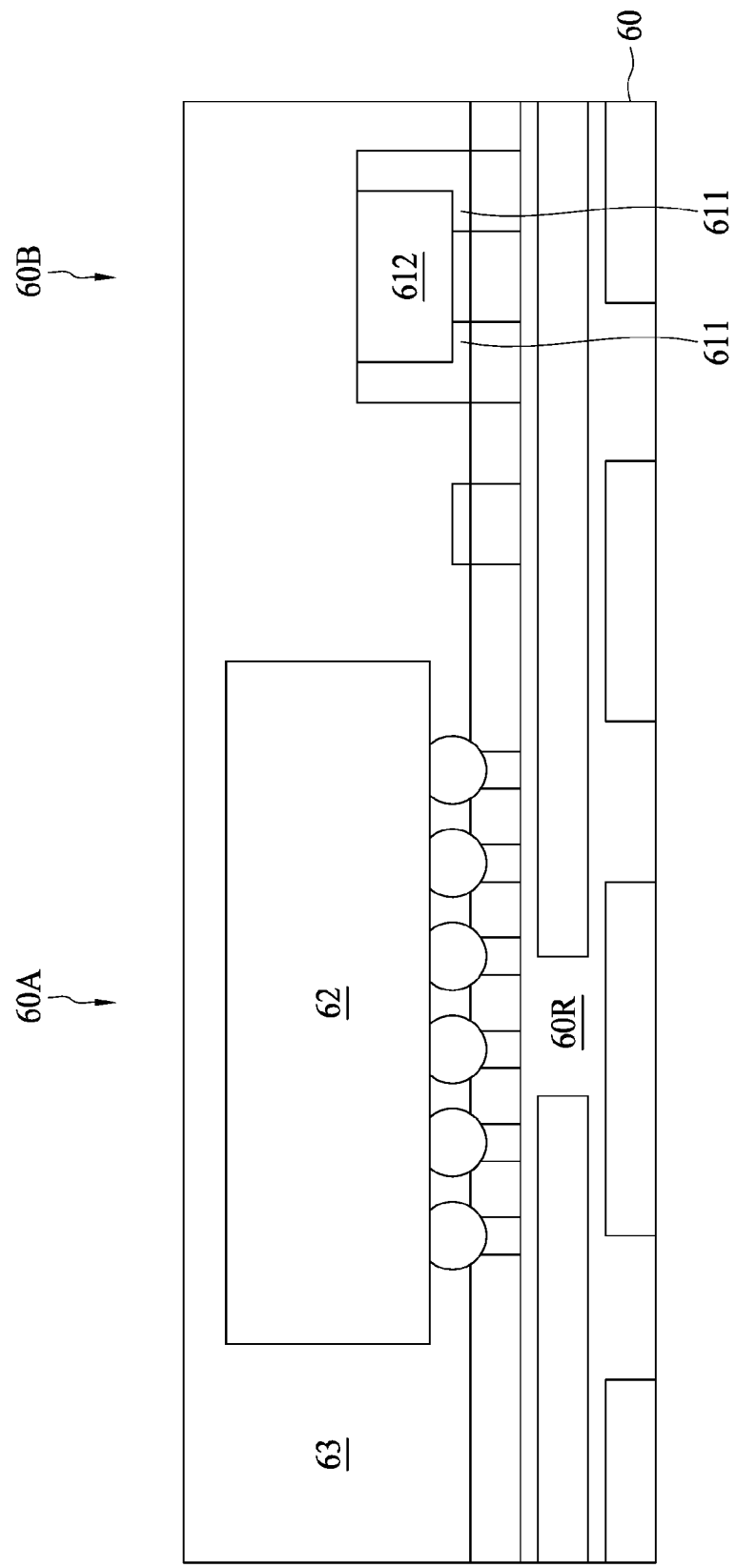

Referring to FIG. 6B, a package body 63 is formed on the first area 60A of the substrate 60 to encapsulate the top surface of the substrate 60, the electronic component 62, the electronic component 612 and the antenna pattern 611. In some embodiments, the package body 63 includes an epoxy resin having fillers dispersed therein. The package body 63 may be formed by a molding technique, such as transfer molding or compression molding.

Figure 6C:
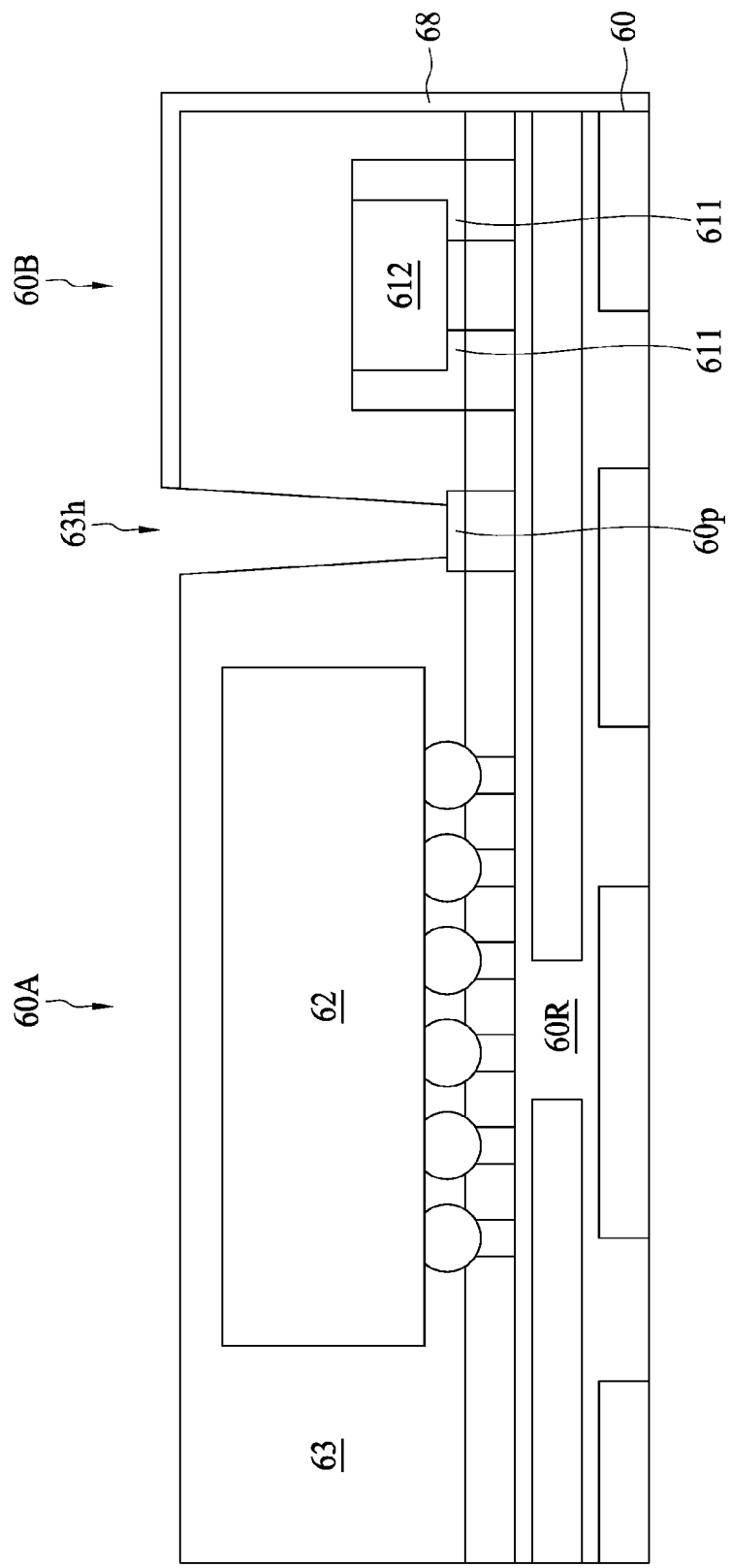

Referring to FIG. 6C, a hole 63h is formed to penetrate through the package body 63 to expose a conductive pad 60p on the substrate 60. The hole 63h may be formed by drilling or etching. Accordingly, in some embodiments, the package body 63 may be divided into two portions, for example, a first package body covering the first area 60A of the substrate 60, including the electronic component 62, and a second package body covering the second area 60B of the substrate 60, including the antenna pattern 611 and the electronic component 612.

A protective layer 68 is formed to cover a portion of the package body 63 that covers the second area 60B of the substrate 60 and the antenna pattern 611. In some embodiments, the protective layer 68 can be a mask or a solder resist, formed of UV cure glue or thermal cure glue.

Figure 6D:
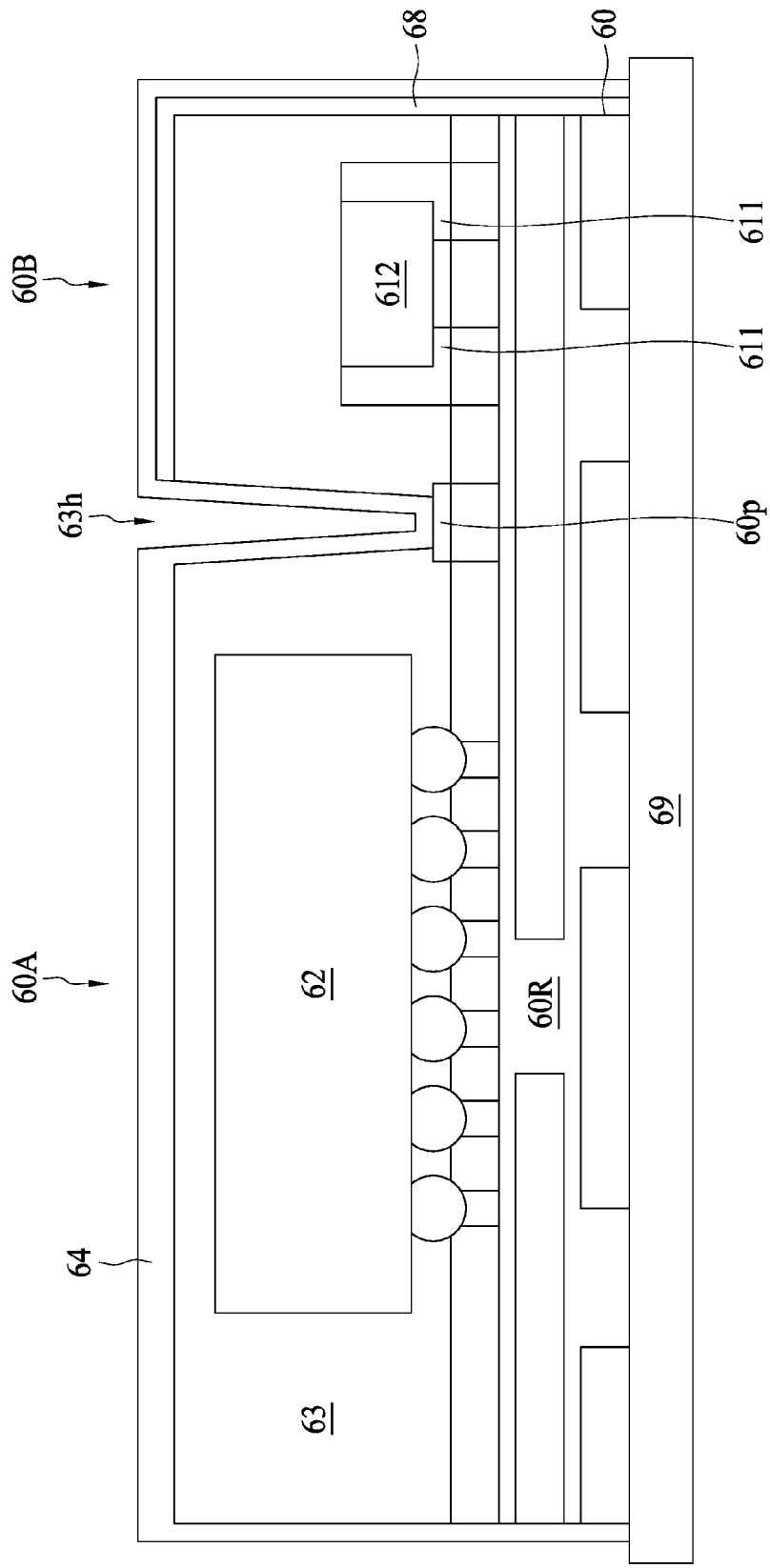

Referring to FIG. 6D, the substrate 60 is placed on a carrier 69. A conformal shield 64 is formed to cover the package body 63, the protective layer 68 and lateral surfaces of the substrate 60. In some embodiments, the conformal shield 64 is a conductive thin film, and may include, for example, Al, Cu, Cr, Sn, Au, Ag, Ni or stainless steel, or a mixture, an alloy, or other combination thereof. The conformal shield 64 may be formed by sputtering a metal coating or by any other suitable process. The conformal shield 64 may include a single conductive layer. In accordance with some embodiments of the present disclosure, the conformal shield 64 may include several conductive layers formed of the same material or of different materials. In some embodiments, each conductive layer may have a thickness of, for example, up to about 200 μm, up to about 150 μm, up to about 100 μm, up to about 50 μm, up to about 10 μm, up to about 5 μm, up to about 1 μm, or up to about 500 nm. In some embodiments, each conductive layer may have a thickness of, for example, down to about 100 nm or less, down to about 50 nm or less, or down to about 10 nm or less.

Figure 6E:
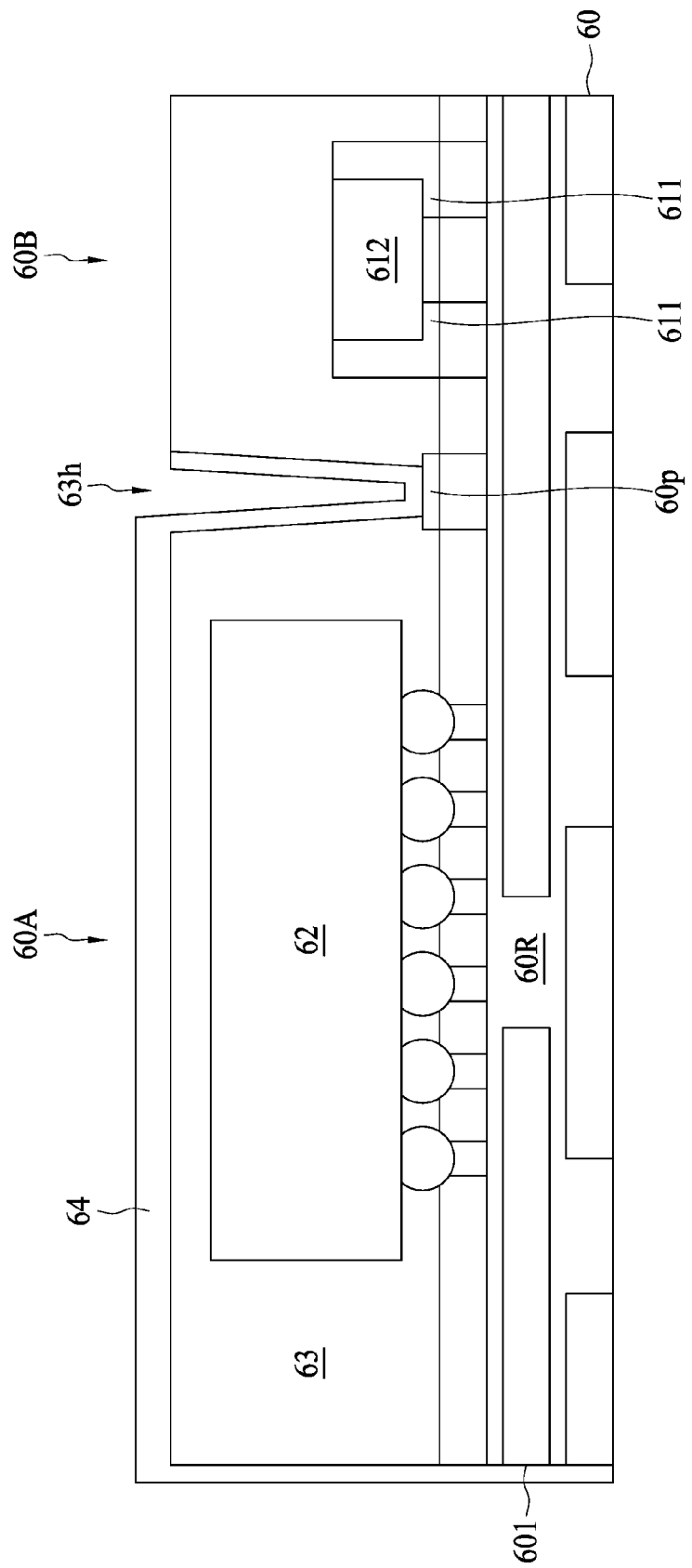

Referring to FIG. 6E, the protective layer 68 and the carrier 69 are removed. Therefore, the conformal shield 64 remains on a lateral surface 601 of the first area 60A of the substrate 60 and a portion of the package body 63 that is not covered by the protective layer 68 during the operation shown in FIG. 6C. In some embodiments, the substrate 60 then may be bonded to a main board or a system board.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor package device, comprising:
   a substrate having a first area and a second area;
   a semiconductor device on the first area of the substrate;
   an antenna pattern on the second area of the substrate;
   a first electronic component on the antenna pattern and electrically connected to the antenna pattern; and
   a first package body encapsulating the first area of the substrate and the semiconductor device and exposing the antenna pattern, the first electronic component and the second area of the substrate.

2. The semiconductor package device according to claim 1, further comprising a second package body encapsulating the second area of the substrate and the antenna pattern.

3. The semiconductor package device according to claim 1, further comprising a second electronic component on the second area of the substrate and a third electronic component on the second area of the substrate, wherein the antenna pattern further comprises:
   a feeding line electrically connected to the semiconductor device;
   a first line segment electrically connected to the feeding line by the first electronic component;
   a second line segment electrically connected to the feeding line by the second electronic component; and
   a third line segment electrically connected to the second line segment by the third electronic component.

4. The semiconductor package device according to claim 1, wherein a ratio of a width of the second area of the substrate to an operating wavelength of the antenna pattern is less than about 0.013.

5. The semiconductor package device according to claim 1, wherein a ratio of a width of the second area of the substrate to a length of the second area of the substrate is less than about 0.25.

6. The semiconductor package device according to claim 1, further comprising a shield on the first package body.

7. An electronic module, comprising:
   a circuit board;
   a first antenna pattern on the circuit board; and
   a semiconductor package device on the circuit board, comprising:
      a substrate comprising a first area and a second area;
      a semiconductor device on the first area of the substrate; and
      a second antenna pattern on the second area of the substrate and electrically connected to the first antenna pattern on the circuit board.

8. The electronic module according to claim 7, further comprising a first electronic component on the circuit board, wherein the first antenna pattern further comprises a first line segment and a second line segment electrically connected to the first line segment by the first electronic component.

9. The electronic module according to claim 8, wherein the first electronic component is a variable capacitor.

10. The electronic module according to claim 8, further comprising a second electronic component on the substrate and a third electronic component on the substrate, wherein the second antenna pattern further comprises a third line segment electrically connected to the first line segment of the first antenna pattern, a feeding line electrically connected to the third line segment by the second electronic component on the substrate, and a fourth line segment electrically connected to the feeding line by the third electronic component on the substrate.

11. The electronic module according to claim 10, further comprising a conductive pattern formed on a sidewall surface of the second area of the substrate, wherein the third line segment of the second antenna pattern is electrically connected to the first line segment of the first antenna pattern by the conductive pattern.

12. The electronic module according to claim 10, wherein the substrate comprises a conductive via, and the third line segment of the second antenna pattern is electrically connected to the first line segment of the first antenna pattern by the conductive via in the substrate, wherein the conductive via is beneath the third electronic component.

13. The electronic module according to claim 7, wherein a ratio of a width of the second area of the substrate to an operating wavelength of the first and second antenna patterns is less than about 0.013.

14. The electronic module according to claim 7, wherein a ratio of a width of the second area of the substrate to a length of the second area of the substrate is less than about 0.25.

15. The electronic module according to claim 7, wherein the semiconductor package device is disposed at a middle and along an edge of the circuit board.

16. The electronic module according to claim 7, wherein the semiconductor package device is disposed at a corner of the circuit board.

17. A semiconductor package device, comprising:
an antenna pattern comprising a feeding line, a first line segment, a second line segment and a third line segment, wherein the feeding line is disposed between the first line segment and the second line segment, and the second line segment is disposed between the feeding line and the third line segment;
a first electronic component electrically connecting the first line segment and the feeding line;
a second electronic component electrically connecting the feeding line and the second line segment; and
a third electronic component electrically connecting the second line segment and the third line segment.

18. The semiconductor package device according to claim 17, further comprising:
a substrate comprising a first area, a second area, a first via and a second via, wherein the antenna pattern, the first electronic component, the second electronic component and the third electronic component are disposed on the second area of the substrate, the first via is formed beneath the first electronic component, and the second via is formed beneath the third electronic component; and
a semiconductor device disposed on the first area of the substrate.

19. The semiconductor package device according to claim 18, further comprising:
a package body covering the first area of the substrate and exposing the second area of the substrate; and
a shield on the package body.

20. The semiconductor package device according to claim 17, further comprising a fourth electronic component, wherein the antenna pattern further comprises a fourth line segment electrically connected to the feeding line via the fourth electronic component, wherein the fourth line segment is substantially parallel to the second line segment.

* * * * *